(12) United States Patent
Ting et al.

(10) Patent No.: US 10,366,991 B1
(45) Date of Patent: Jul. 30, 2019

(54) SEMICONDUCTOR DEVICE AND MANUFACTURING METHOD THEREOF

(71) Applicant: UNITED MICROELECTRONICS CORP., Hsin-Chu (TW)

(72) Inventors: Hsu Ting, Tainan (TW); Yu-Ying Lin, Tainan (TW); Yen-Hsing Chen, Taipei (TW); Chun-Jen Chen, Tainan (TW); Chun-Wei Yu, Tainan (TW); Keng-Jen Lin, Kaohsiung (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/880,492

(22) Filed: Jan. 25, 2018

(30) Foreign Application Priority Data

Jan. 15, 2018 (CN) .......................... 2018 1 0035934

(51) Int. Cl.
*H01L 27/088* (2006.01)
*H01L 29/66* (2006.01)
*H01L 21/8234* (2006.01)
*H01L 29/06* (2006.01)

(52) U.S. Cl.
CPC .. *H01L 27/0886* (2013.01); *H01L 21/823431* (2013.01); *H01L 21/823481* (2013.01); *H01L 29/0653* (2013.01); *H01L 29/66545* (2013.01)

(58) Field of Classification Search
CPC ......... H01L 27/00886; H01L 27/10826; H01L 27/10879; H01L 27/1211; H01L 27/0924; H01L 29/0653; H01L 29/66545; H01L 29/42791; H01L 29/66795; H01L 29/785; H01L 21/823481; H01L 21/823431; H01L 21/823821; H01L 21/845
See application file for complete search history.

(56) References Cited

U.S. PATENT DOCUMENTS

| | | | |
|---|---|---|---|
| 2005/0145941 A1* | 7/2005 | Bedell | H01L 21/845 257/348 |
| 2013/0171794 A1* | 7/2013 | Pei | H01L 29/6656 438/300 |
| 2013/0193446 A1* | 8/2013 | Chao | H01L 29/66795 257/77 |
| 2013/0200483 A1* | 8/2013 | Tung | H01L 21/3065 257/506 |
| 2015/0179768 A1* | 6/2015 | Chen | H01L 29/66795 257/401 |
| 2016/0204255 A1* | 7/2016 | Lin | H01L 21/823412 257/194 |

(Continued)

*Primary Examiner* — Galina G Yushina
(74) *Attorney, Agent, or Firm* — Winston Hsu (57) ABSTRACT

A semiconductor device includes a semiconductor substrate, an isolation structure, a cladding layer, and a gate structure. The semiconductor substrate includes fin shaped structures. The isolation structure is disposed between the fin shaped structures. Each of the fin shaped structures includes a first portion disposed above a top surface of the isolation structure and a second portion disposed on the first portion. A width of the second portion is smaller than a width of the first portion. The cladding layer is disposed on the first portion and the second portion of each of the fin shaped structures. The cladding layer includes a curved surface. The gate structure is disposed straddling the fin shaped structures.

22 Claims, 11 Drawing Sheets (56) References Cited

U.S. PATENT DOCUMENTS

2016/0351701 A1  12/2016  Cea
2017/0133376 A1   5/2017  Glass
2017/0221892 A1*  8/2017  Li ......................... H01L 21/324

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including fin shaped structures and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Transistors are important semiconductor devices in the integrated circuits. In recent years, there is a development for three-dimensional or non-planar field effect transistors (FETs) such as fin field effect transistors (Fin-FETs) for replacing the planar FETs. However, with the increasing miniaturization of electronic products, it is still important to modify the structural and/or the material design of the Fin-FETs for improving the manufacturing yield and enhancing the device performance.

SUMMARY OF THE INVENTION

A semiconductor device and a manufacturing method thereof are provided in the present invention. A fin shaped structure having a first portion disposed above a top surface of an isolation structure and a second portion disposed on the first portion is formed. A width of the second portion is smaller than a width of the first portion. A cladding layer having a curved surface is formed on the first portion and the second portion of the fin shaped structure for enhancing the electrical performance of the semiconductor device.

According to an embodiment of the present invention, a semiconductor device is provided. The semiconductor device includes a semiconductor substrate, an isolation structure, a cladding layer, and a gate structure. The semiconductor substrate includes fin shaped structures. The isolation structure is disposed between the fin shaped structures. Each of the fin shaped structures includes a first portion and a second portion. The first portion is disposed above a top surface of the isolation structure. The second portion is disposed on the first portion. A width of the second portion is smaller than a width of the first portion. The cladding layer is disposed on the first portion and the second portion of each of the fin shaped structures, and the cladding layer includes a curved surface. The gate structure is disposed straddling the fin shaped structures.

According to an embodiment of the present invention, a manufacturing method of a semiconductor device is provided. The manufacturing method includes the following steps. A semiconductor substrate is provided, and the semiconductor substrate includes fin shaped structures. An isolation structure is formed between the fin shaped structures. Each of the fin shaped structures includes a first portion and a second portion. The first portion is disposed above a top surface of the isolation structure. The second portion is disposed on the first portion. A width of the second portion is smaller than a width of the first portion. A cladding layer is formed on the first portion and the second portion of each of the fin shaped structures, and the cladding layer includes a curved surface. A gate structure is formed straddling the fin shaped structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-5 are schematic drawings illustrating a manufacturing method of the semiconductor device according to the first embodiment of the present invention, wherein FIG. 4 is a schematic drawing in a step subsequent to FIG. 3, and FIG. 5 is a schematic drawing in a step subsequent to FIG. 4.

FIGS. 7-11 are schematic drawings illustrating a manufacturing method of a semiconductor device according to a third embodiment of the present invention, wherein FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

DETAILED DESCRIPTION

Figure 1:
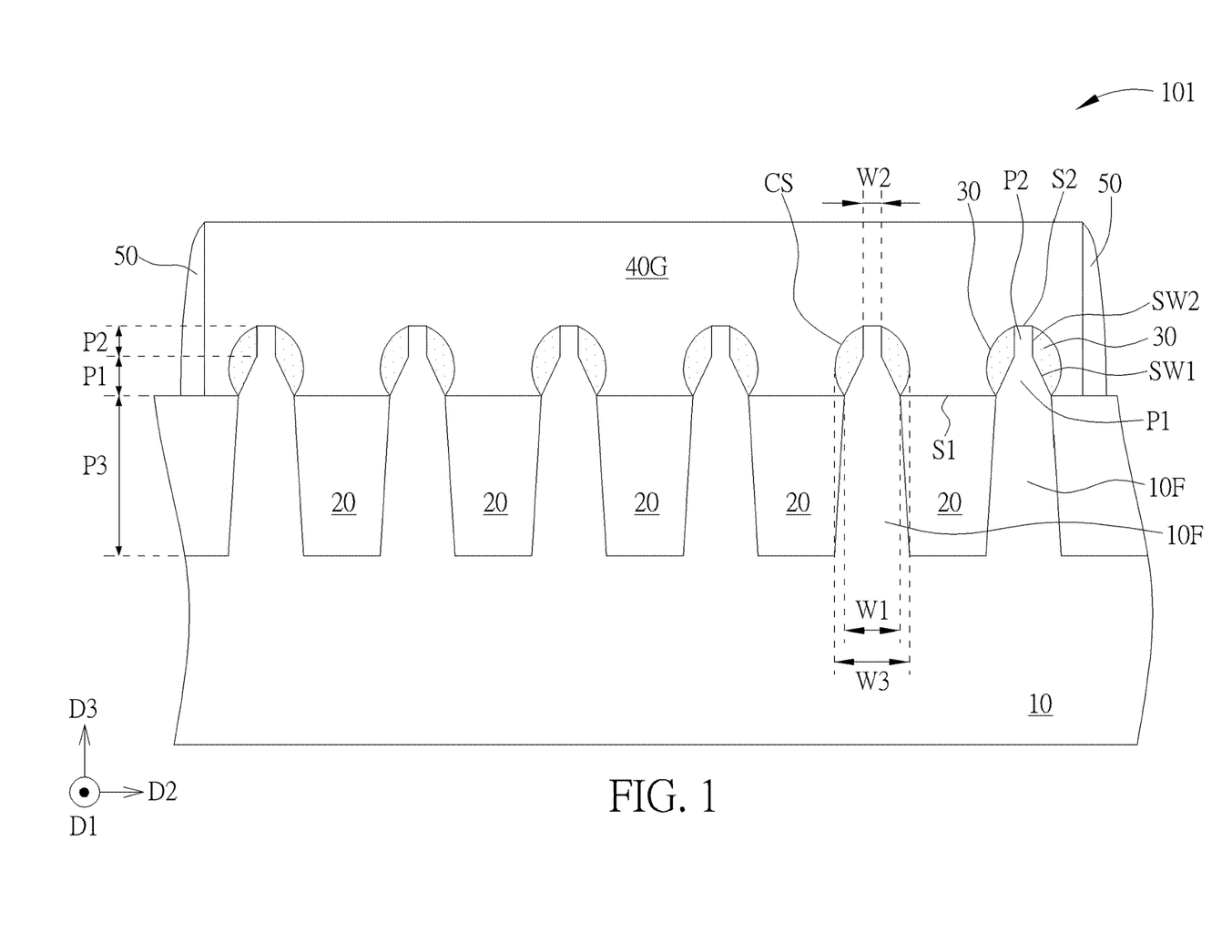
FIG. 1 is a schematic drawing illustrating a semiconductor device according to a first embodiment of the present invention.
Figure 2:
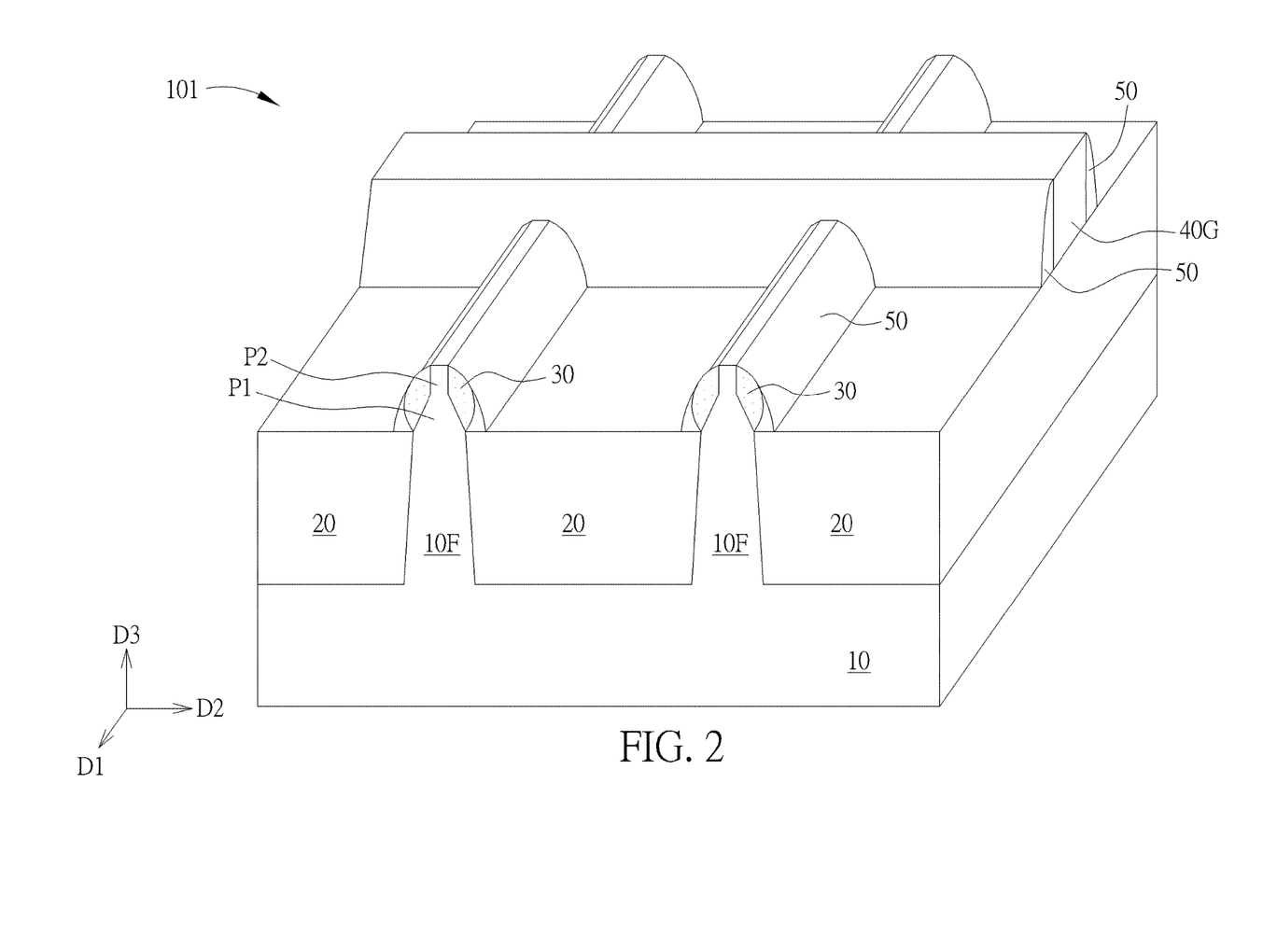
FIG. 2 is a stereoscopic schematic drawing illustrating the semiconductor device according to the first embodiment of the present invention.

Please refer to FIG. 1 and FIG. 2. FIG. 1 is a schematic drawing illustrating a semiconductor device according to a first embodiment of the present invention, and FIG. 2 is a stereoscopic schematic drawing illustrating the semiconductor device in this embodiment. As shown in FIG. 1 and FIG. 2, a semiconductor device 101 is provided in this embodiment. The semiconductor device 101 includes a semiconductor substrate 10, an isolation structure 20, a cladding layer 30, and a gate structure 40G. In some embodiments, the semiconductor substrate 10 may include a silicon substrate, an epitaxial substrate, a silicon germanium substrate, a silicon carbide substrate, or a silicon-on-insulator (SOI) substrate, but not limited thereto. The semiconductor substrate 10 includes at least one fin shaped structure 10F, and the fin shaped structure 10F includes a fin shaped structure of a semiconductor material, such as a silicon semiconductor fin shaped structure. In this embodiment, the semiconductor substrate 10 may include a plurality of the fin shaped structures 10F. Each of the fin shaped structures 10F may be elongated in a first direction D1, the fin shaped structures 10F may be arranged repeatedly in a second direction D2, and the first direction D1 may be substantially perpendicular to the second direction D2, but not limited thereto. The fin shaped structures 10F may be formed by performing a patterning process (such as a multiple exposure process and an etching process) to the semiconductor substrate 10. The isolation structure 20 is disposed between the fin shaped structures 10F.

The isolation structure 20 may be regarded as a shallow trench isolation, and the isolation structure 20 may include a single layer or multiple layers of insulation materials, such as an oxide insulation material, but not limited thereto. Each of the fin shaped structures 10F may be partly covered by the isolation structure 20 and partly not covered by the isolation structure 20. The portion of each of the fin shaped structures 10F which is not covered by the isolation structure 20 may be located above a top surface of the isolation structure 20 (such as a first top surface S1 shown in FIG. 1) in a thickness direction of the semiconductor substrate 10 (such as a third direction D3 shown in FIG. 1 and FIG. 2), and the first top surface S1 may be the topmost surface of the isolation structure 20 in the third direction D3, but not limited thereto. Specifically, each of the fin shaped structures 10F may include a third portion P3, a first portion P1, and a second portion P2 sequentially arranged and disposed in the third direction D3. The third portion P3 of each of the fin shaped structures 10F may be covered by the isolation structure 20, and the first portion P1 and the second portion P2 of each of the fin shaped structures 10F are not covered by the isolation structure 20. In other words, the first portion P1 and the second portion P2 of each of the fin shaped structures 10F may be disposed above the first top surface S1 of the isolation structure 20 in the third direction D3, and the second portion P2 is disposed on the first portion P1 in the third direction D3. The first portion P1 and the second portion P2 of each of the fin shaped structures 10F may protrude from the first top surface S1 of the isolation structure 20. A width of the second portion P2 (such as a second width W2 shown in FIG. 1) is smaller than a width of the first portion P1 (such as a first width W1 shown in FIG. 1). Additionally, the first width W1 of the first portion P1 and the second width W2 of the second portion P2 may also be regarded as lengths in the second direction D2, but not limited thereto.

The cladding layer 30 is disposed on the first portion P1 and the second portion P2 of each of the fin shaped structures 10F, and the cladding layer 30 includes a curved surface CS. Specifically, the curved surface CS of the cladding layer 30 may be a surface which does not contact the fin shaped structure 10F, but not limited thereto. A width of the cladding layer 30 disposed on one of the fin shaped structures 10F (such as a third width W3 shown in FIG. 1) may be larger than the first width W1 of the first portion P1 of the fin shaped structure 10F because the cladding layer 30 covering the first portion P1 and the second portion P2 of the fin shaped structure 10F has the curved surface CS protruding outwards and the cladding layer 30 may be disposed on two opposite sides of the first portion P1 of each fin shaped structure 10F in the second direction D2 and on two opposite sides of the second portion P2 of each fin shaped structure 10F in the second direction D2. The first width W1, the second width W2, and the third width W3 may be the maximum widths of the first portion P1, the second portion P2, and the cladding layer 30 on one of the fin shaped structures 10F respectively, but not limited thereto. In some embodiments, a lattice constant of the cladding layer 30 may be different from a lattice constant of the fin shaped structures 10F. For example, the material of the cladding layer 30 may include germanium (Ge), silicon germanium (SiGe), silicon phosphide (SiP), or other suitable semiconductor materials. The first portion P1 and the second portion P2 of the fin shaped structure 10F and the cladding layer 30 may be regarded as the channel region in the semiconductor device 101. Additionally, the cladding layer 30 disposed on two adjacent fin shaped structures 10F may be separated from each other, but not limited thereto. In some embodiments, the cladding layer 30 disposed on the two opposite sides of the first portion P1 and the second portion P2 of each of the fin shaped structures 10F may provide a compressive stress to the first portion P1 and the second portion P2 of each of the fin shaped structures 10F for enhancing the carrier mobility of the channel region, but not limited thereto.

In some embodiments, the cladding layer 30 may be disposed on a sidewall of the first portion P1 (such as a first sidewall SW1 shown in FIG. 1) of each of the fin shaped structures 10F and a sidewall of the second portion P2 (such as a second sidewall SW2 shown in FIG. 1) of each of the fin shaped structures 10F. A slope of the first sidewall SW1 of the first portion P1 of each of the fin shaped structures 10F may be smaller than a slope of the second sidewall SW2 of the second portion P2 of each of the fin shaped structures 10F. A horizontal plane (such as a plane formed by the first direction D1 and the second direction D2) may be used to calculate the slope of the first sidewall SW1 and the slope of the second sidewall SW2 mentioned above, but not limited thereto. In other words, the second sidewall SW2 of the second portion P2 of each fin shaped structure 10F may be steeper than the first sidewall SW1 of the first portion P1, and the distribution of the first sidewall SW1 and the second sidewall SW2 may be formed by an etching process, but not limited thereto.

As shown in FIG. 1 and FIG. 2, the gate structure 40G is disposed straddling the fin shaped structures 10F. In some embodiments, the gate structure 40G may be elongated in the second direction D2, but not limited thereto. Additionally, the gate structure 40G may include a dummy gate structure, a metal gate structure, or other suitable types of gate structures. The dummy gate structure mentioned above may be a dummy gate structure used in a replacement metal gate (RMG) process, and the material of the dummy gate structure may include a semiconductor material such as polysilicon and amorphous silicon, but not limited thereto. In some embodiments, the gate structure 40G may also include conductive materials and insulation materials according to other considerations, such as a low resistivity metal conductive material, a work function metal layer, and a high dielectric constant (high-k) dielectric layer in a metal gate structure, but not limited thereto. Additionally, a spacer 50 may be disposed on sidewalls of the gate structure 40G. The material of the spacer 50 may include oxide, nitride, oxynitride, or other suitable insulation materials, and the spacer 50 may be formed by a single layer or multiple layers of the materials mentioned above. In some embodiments, the spacer 50 may partly disposed on the cladding layer 30, but not limited thereto. Additionally, the gate structure 40G may be partially disposed on the cladding layer 30. The contact area between the gate structure 40G and the cladding layer 30 may be increased because the cladding layer 30 has the curved surface CS protruding outwards, and the electrical performance of the semiconductor device 101 may be enhanced accordingly. Additionally, in some embodiments, a top surface of the second portion P2 (such as a second top surface S2 shown in FIG. 1) of each of the fin shaped structures 10F may not be covered by the cladding layer 30, but not limited thereto.

Figure 3:
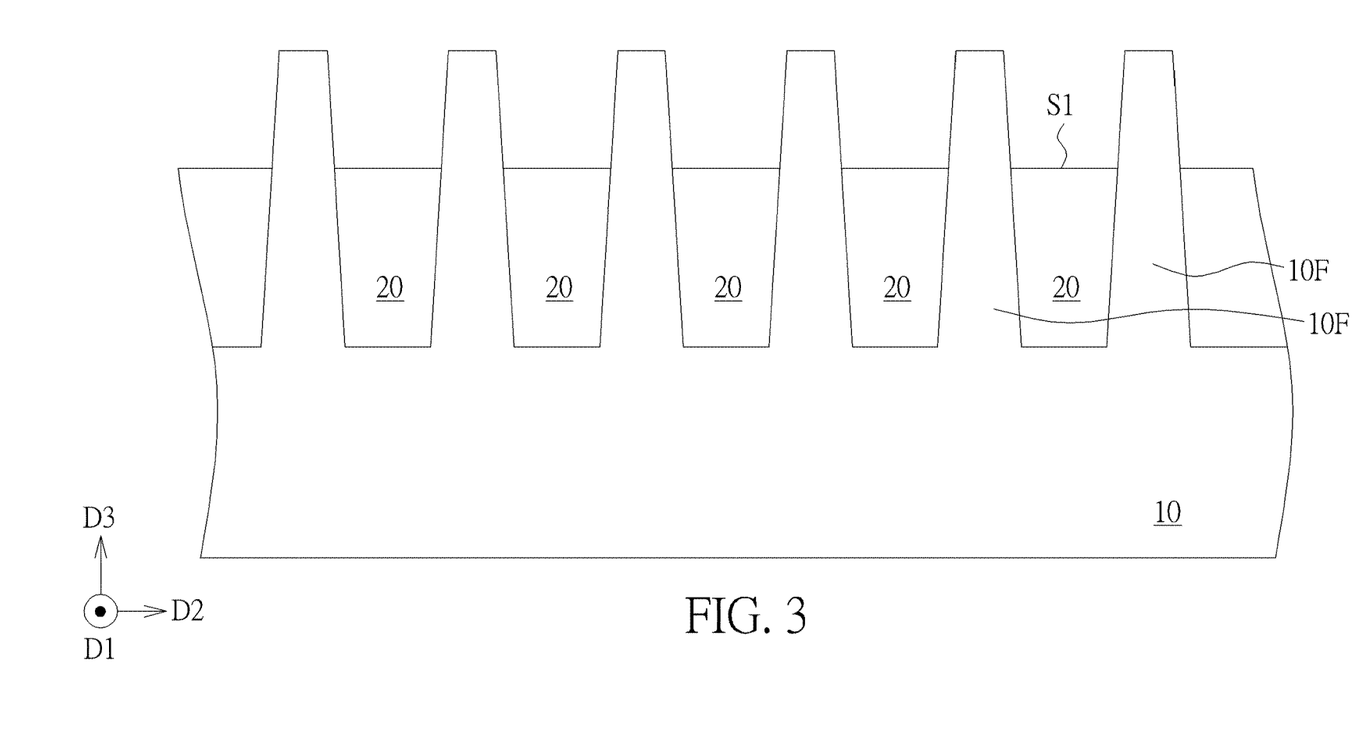
Figure 4:
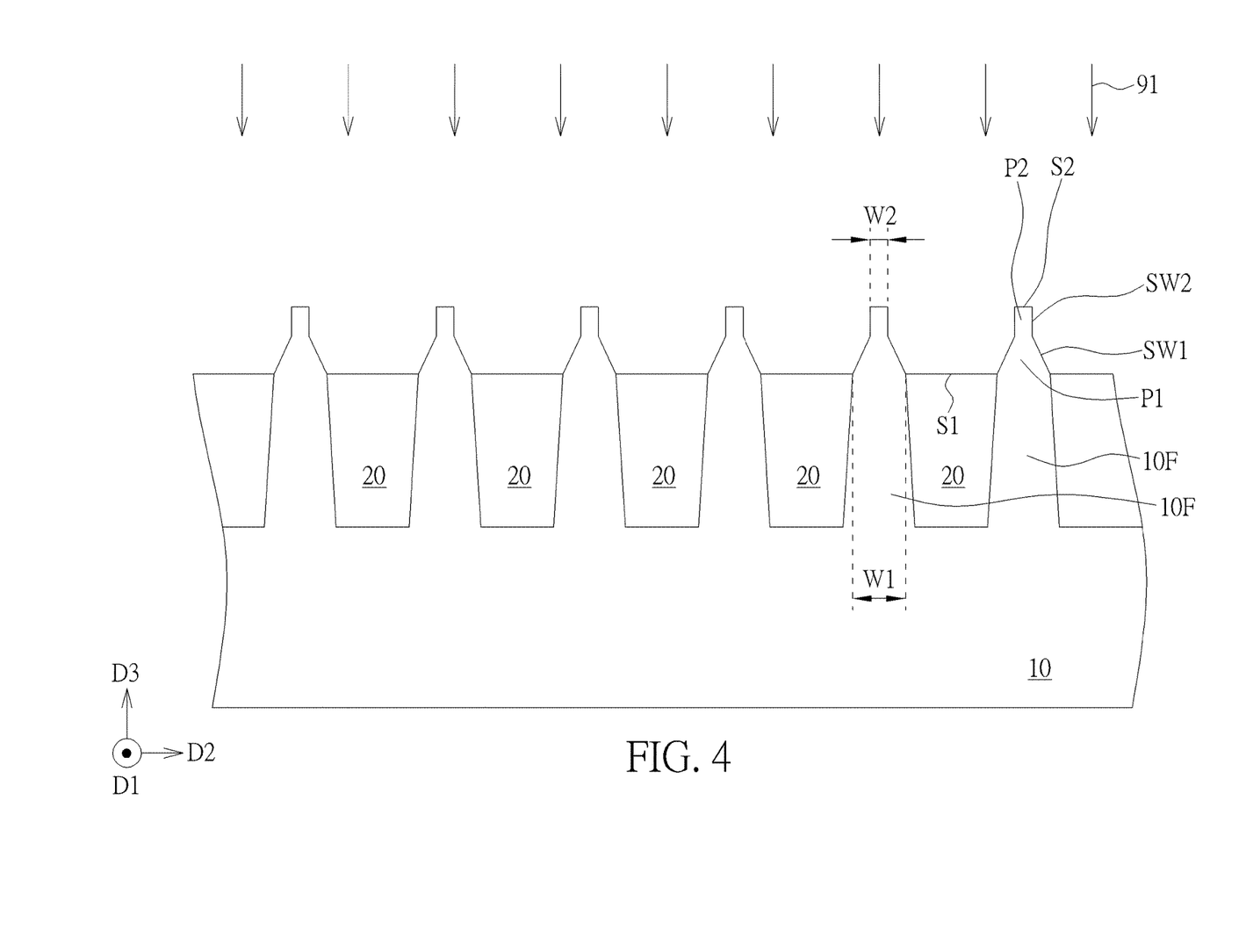
Figure 5:
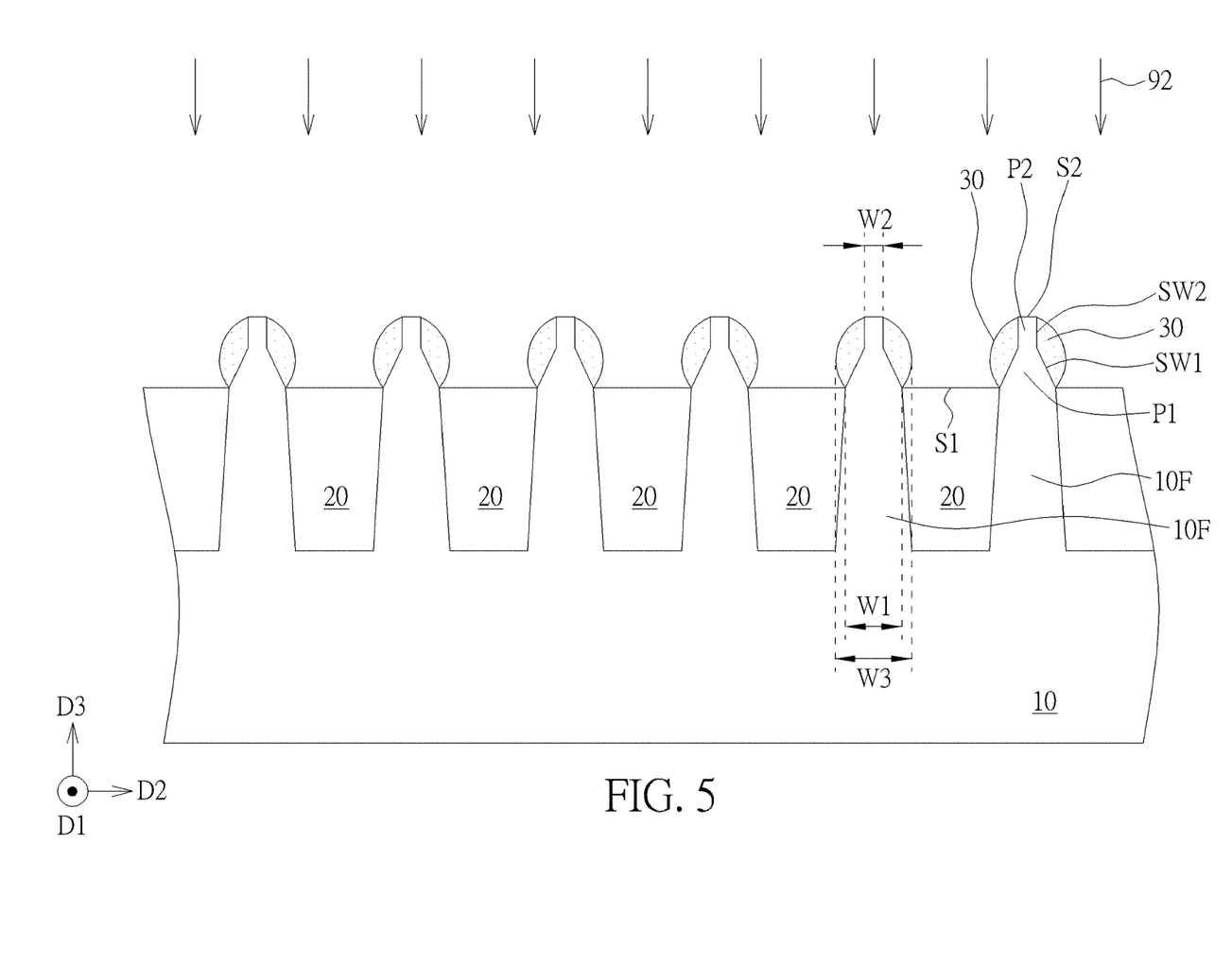

Please refer to FIGS. 3-5 and FIG. 1. FIGS. 3-5 are schematic drawings illustrating a manufacturing method of the semiconductor device according to the first embodiment of the present invention, and FIG. 1 may be regarded as a schematic drawing in a step subsequent to FIG. 5. As shown in FIG. 1, the manufacturing method of the semiconductor device 101 may include the following steps. Firstly, the semiconductor substrate 10 is provided, and the semiconductor substrate 10 includes the fin shaped structures 10F. The isolation structure 20 is formed between the fin shaped structures 10F. Each of the fin shaped structures 10F includes the first portion P1 and the second portion P2. The first portion P1 is disposed above the first top surface S1 of the isolation structure 20 in the third direction D3, and the second portion P2 is disposed on the first portion P1. The second width W2 of the second portion P2 is smaller than the first width W1 of the first portion P1. Subsequently, the cladding layer 30 is formed on the first portion P1 and the second portion P2 of each of the fin shaped structures 10F, and the cladding layer 30 includes the curved surface CS. The gate structure 40G is formed straddling the fin shaped structures 10F.

Specifically, the manufacturing method of the semiconductor device 101 in this embodiment may include but is not limited to the following steps. As shown in FIG. 3, after performing the patterning process to the semiconductor substrate 10 for forming the fin shaped structures 10F, an isolation material is formed on the semiconductor substrate 10 and the fin shaped structures 10F, and an etching back process is performed to the isolation material for exposing the top portion of each of the fin shaped structures 10F and forming the isolation structure 20. In other words, the first top surface S1 of the isolation structure 20 is lower than the topmost surface of each of the fin shaped structures 10F in the third direction D3. Subsequently, as shown in FIG. 4, an etching process 91 is performed to the part of each of the fin shaped structures 10F which is not covered by the isolation structure 20 for forming the first portion P1 and the second portion P2 mentioned above. In other words, in some embodiments, the first portion P1 and the second portion P2 of each of the fin shaped structures 10F is formed by performing the etching process 91 to the fin shaped structures after the step of forming the isolation structure 20, but not limited thereto. It is worth noting that the etching process 91 may include an isotropic etching process, such as a wet etching process using tetramethylammonium hydroxide (TMAH) or wet etching processes using other suitable etchants. The differences in width and sidewall conditions between the first portion P1 and the second portion P2 of each of the fin shaped structures 10F may be obtained by the difference in etching rate between different lattice directions of the fin shaped structure 10F in the etchant of the wet etching process. For example, when the fin shaped structures 10F are silicon fin shaped structures, the etching rate of the <111> surface of silicon in TMAH is lower than the etching rate of the <100> surface of silicon in TMAH, the first portion P1 may be formed with larger width, and the slope of the first sidewall SW1 of the first portion P1 may be smaller than the slope of the second sidewall SW2 of the second portion P2 accordingly.

As shown in FIG. 5, the cladding layer 30 is subsequently formed on the first portion P1 and the second portion P2 of each of the fin shaped structures 10F. In some embodiments, the step of forming the cladding layer 30 may include a selective epitaxial growth (SEG) process 92, but the present invention is not limited to this. In some embodiments, other processes such as a deposition process and a patterning process may also be used to form the cladding layer 30 according to other considerations. The third width W3 of the cladding layer 30 formed on one of the fin shaped structures 10F may be larger than the first width W1 of the first portion P1 of the fin shaped structure 10F because the cladding layer 30 covering the first portion P1 and the second portion P2 of the fin shaped structure 10F has the curved surface CS protruding outwards and the cladding layer 30 may be formed on two opposite sides of the first portion P1 of each fin shaped structure 10F in the second direction D2 and on two opposite sides of the second portion P2 of each fin shaped structure 10F in the second direction D2. Additionally, the cladding layer 30 may be formed on the first sidewall SW1 of the first portion P1 of each fin shaped structure 10F and on the second sidewall SW2 of the second portion P2 of each fin shaped structure 10F, and the slope of the first sidewall SW1 may be smaller than the slope of the second sidewall SW2. As shown in FIG. 1, the gate structure 40G and the spacer 50 are formed subsequently. In other words, in some embodiments, the gate structure 40G may be formed after the step of forming the cladding layer 30, and the gate structure 40G may include a dummy gate structure, a metal gate structure, or other suitable types of gate structures. In addition, the gate structure 40G may be partially formed on the cladding layer 30, and the gate structure 40G may be formed between the cladding layers 30 on two of the fin shaped structures 10F adjacent to each other in the second direction D2.

As shown in FIG. 1 and FIG. 2, in some embodiments, source/drain regions may be formed in portions of the fin shaped structures 10F and the cladding layer 30 which are not covered by the gate structure 40G. The source/drain regions may be formed by performing one or more doping processes to the portions of the fin shaped structures 10F and the cladding layer 30 which are not covered by the gate structure 40G, or the portions of the fin shaped structures 10F and the cladding layer 30 which are not covered by the gate structure 40G may be partially removed for forming epitaxial layers of source/drain regions. In other words, in some embodiments, the epitaxial layers of the source/drain regions and the cladding layer 30 of the channel region may be formed together for process simplification, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
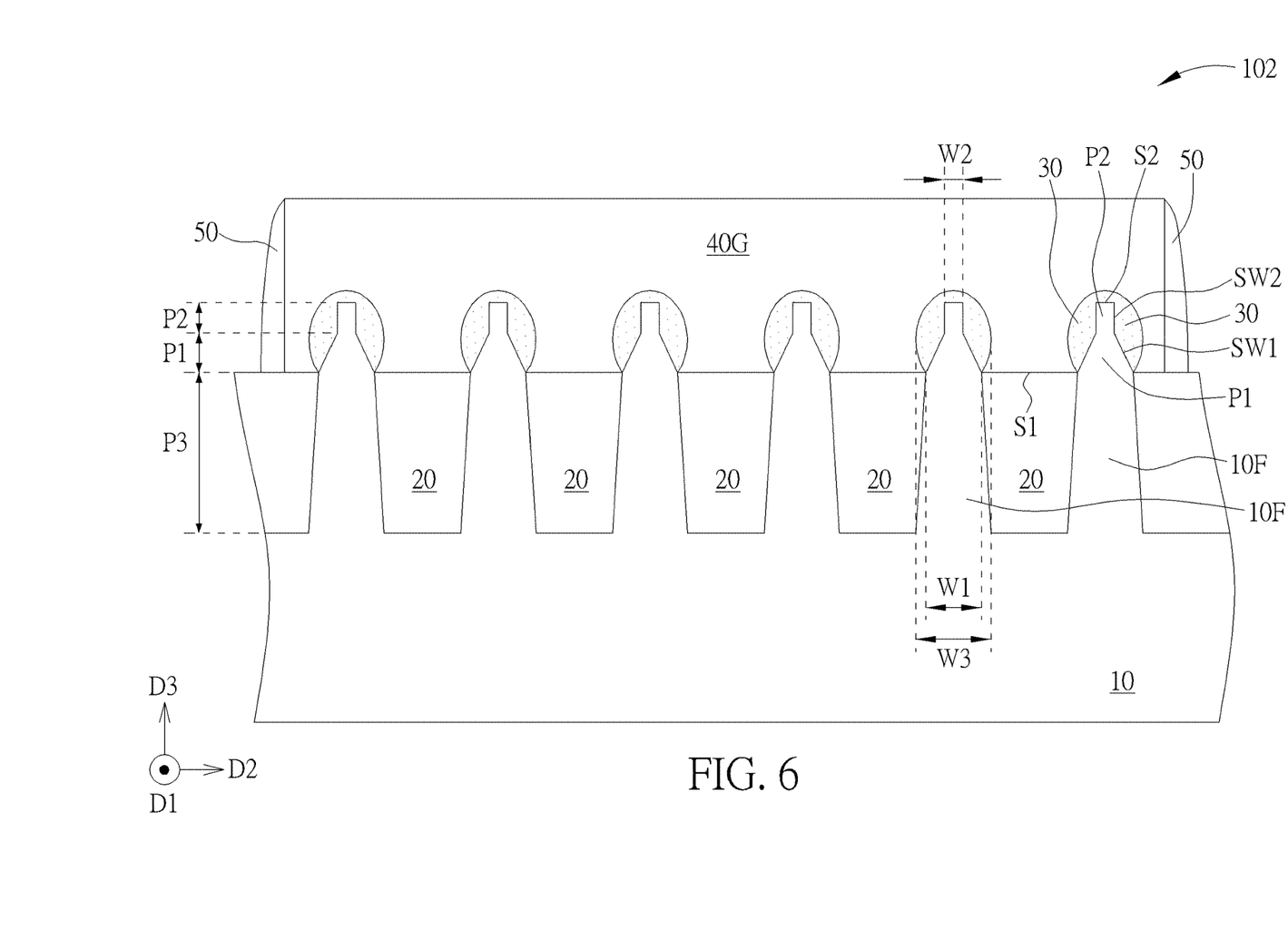
FIG. 6 is a schematic drawing illustrating a semiconductor device according to a second embodiment of the present invention.

Please refer to FIG. 6. FIG. 6 is a schematic drawing illustrating a semiconductor device 102 according to a second embodiment of the present invention. As shown in FIG. 6, the difference between the semiconductor device 102 and the semiconductor device of the first embodiment mentioned above is that, in the semiconductor device 102, the cladding layer 30 may be further disposed on the second top surface S2 of the second portion P2 of each of the fin shaped structures 10F. In other words, in the manufacturing method of the semiconductor device 102, the cladding layer 30 may be further formed on the second top surface S2 of the second portion P2 of each of the fin shaped structures 10F by modifying the process conditions for forming the cladding layer 30 (such as the process conditions of the selective epitaxial growth process).

Figure 7:
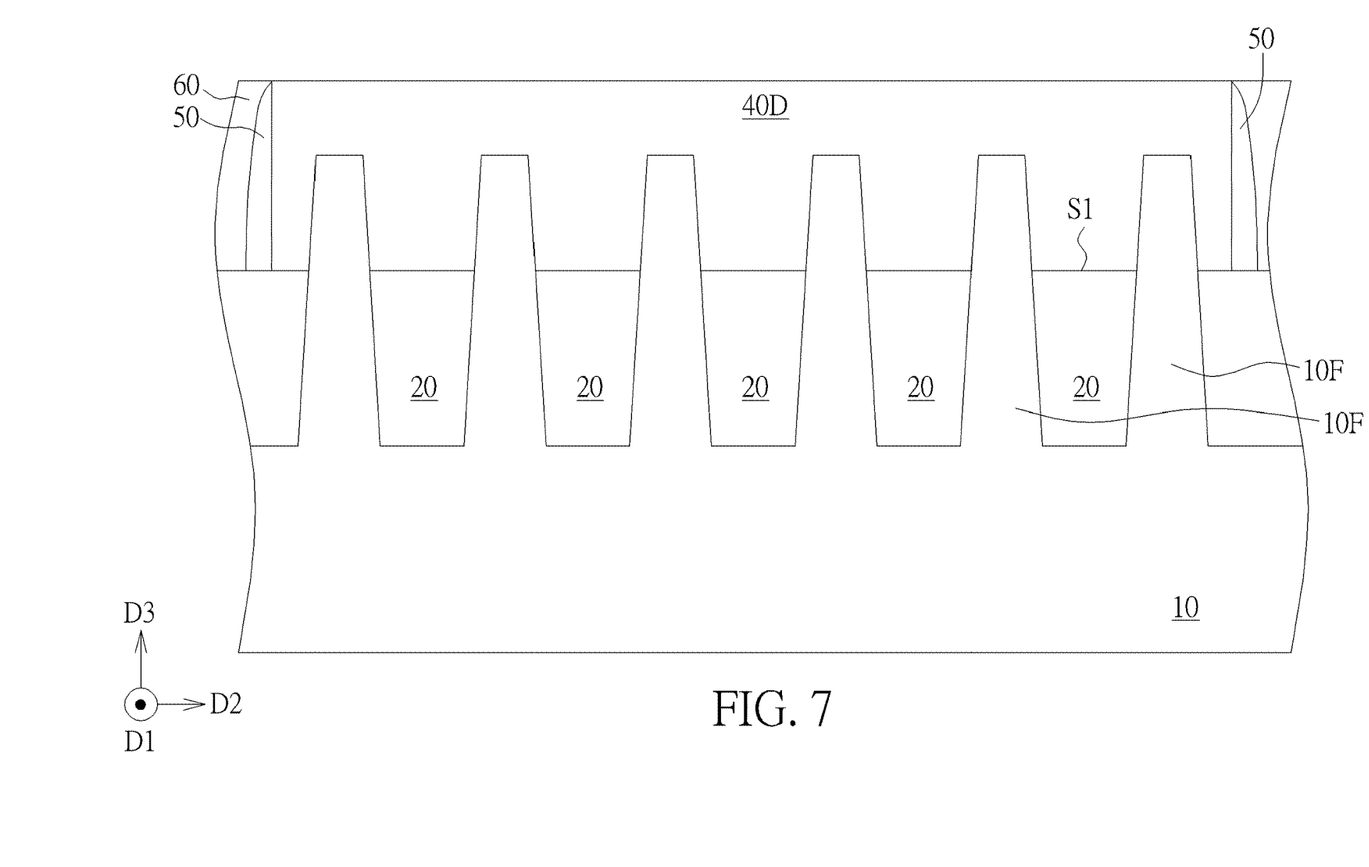
Figure 8:
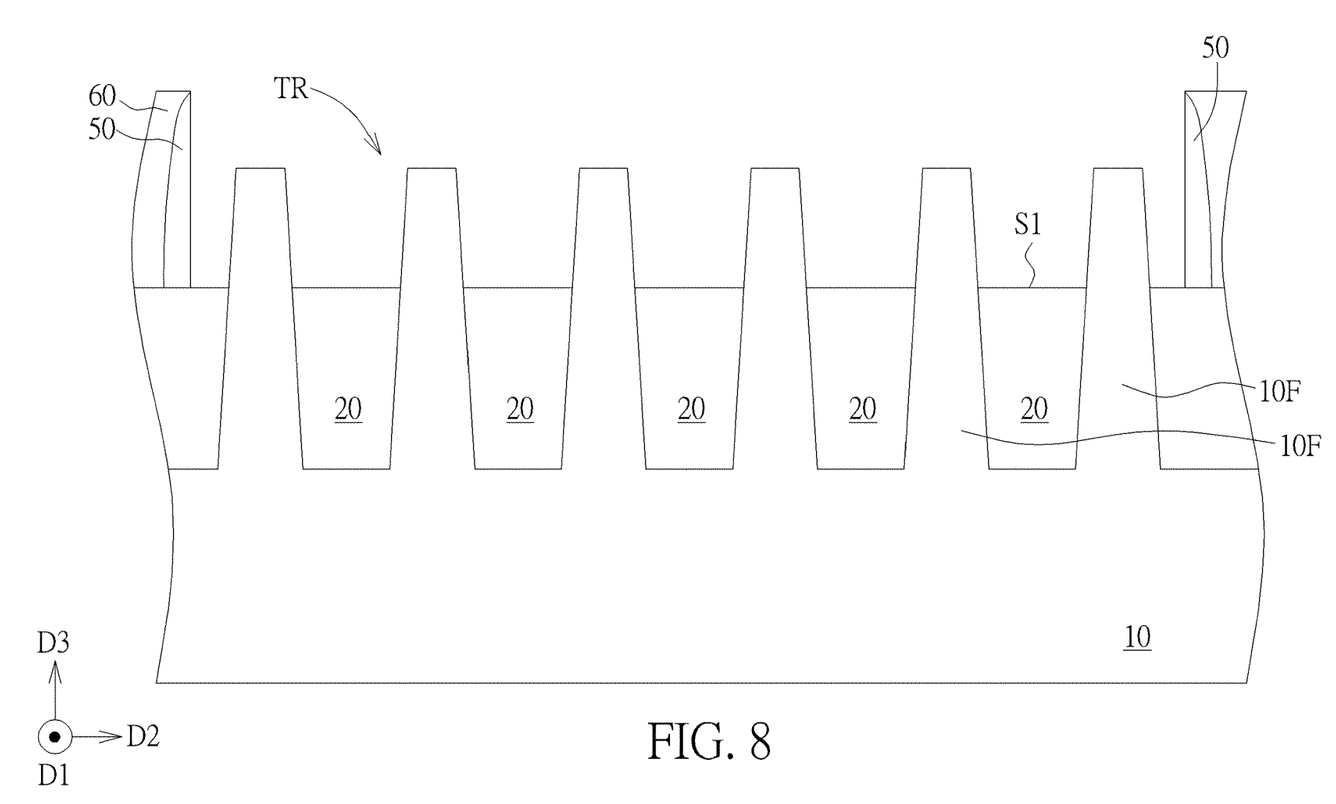
Figure 9:
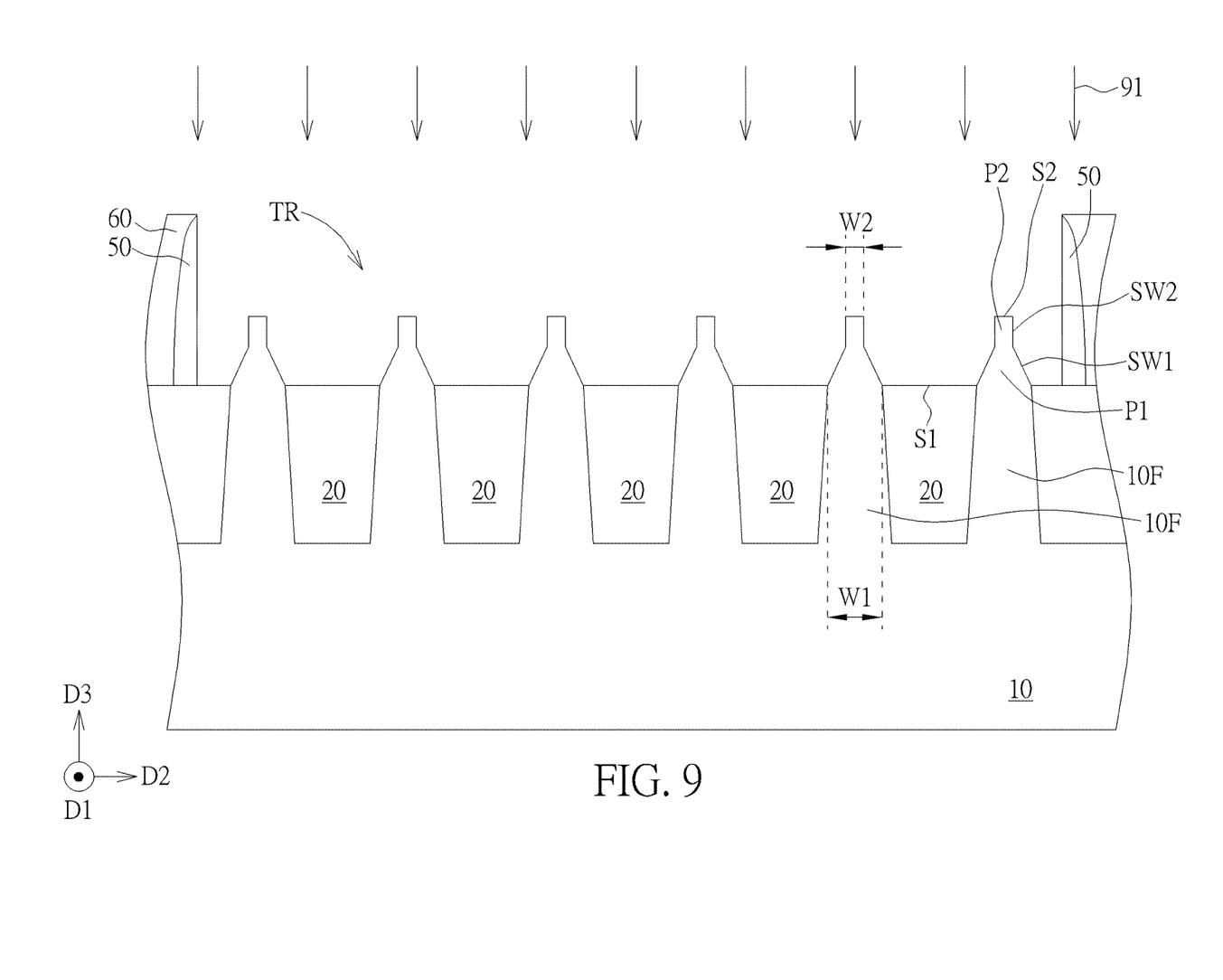
Figure 10:
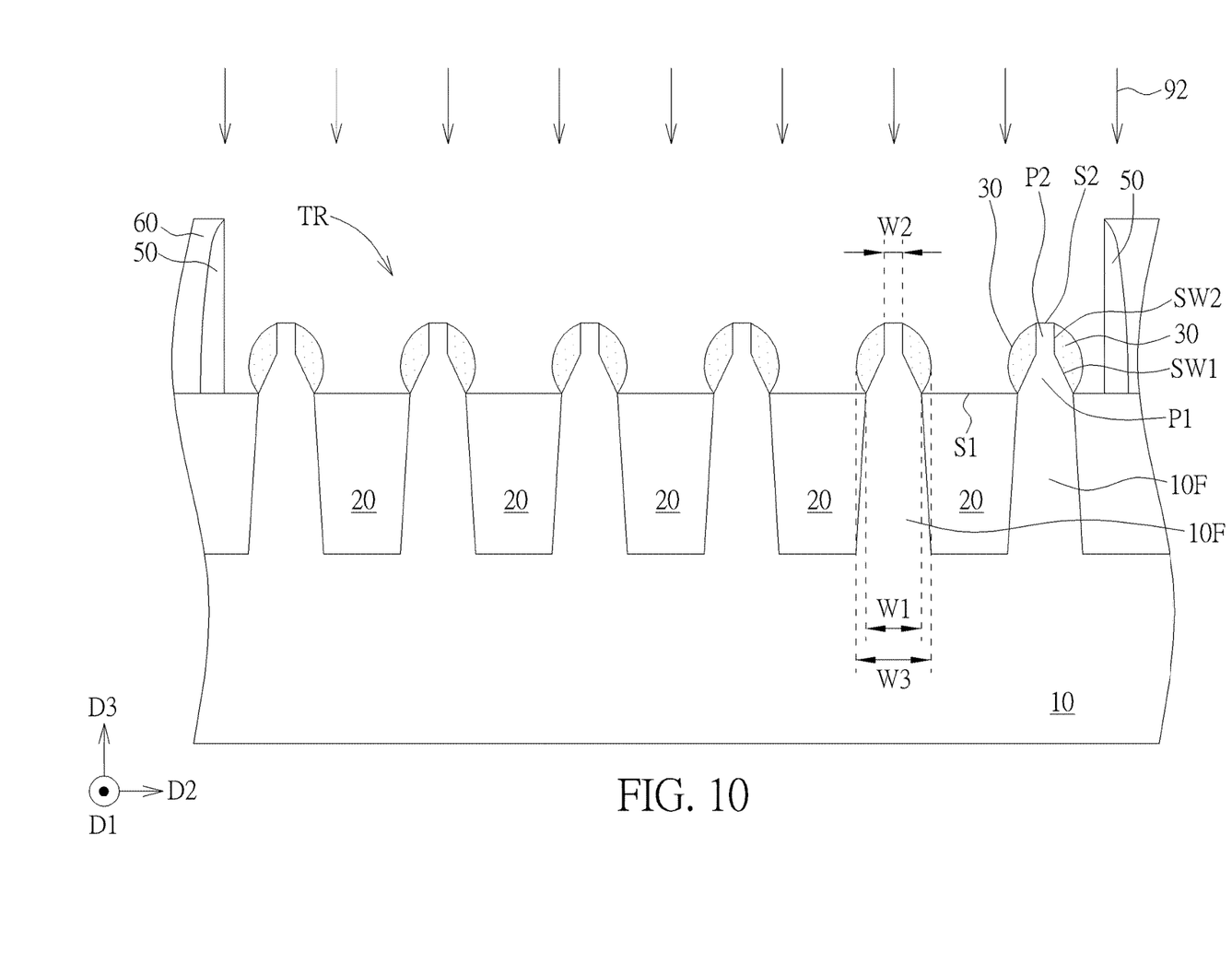
Figure 11:
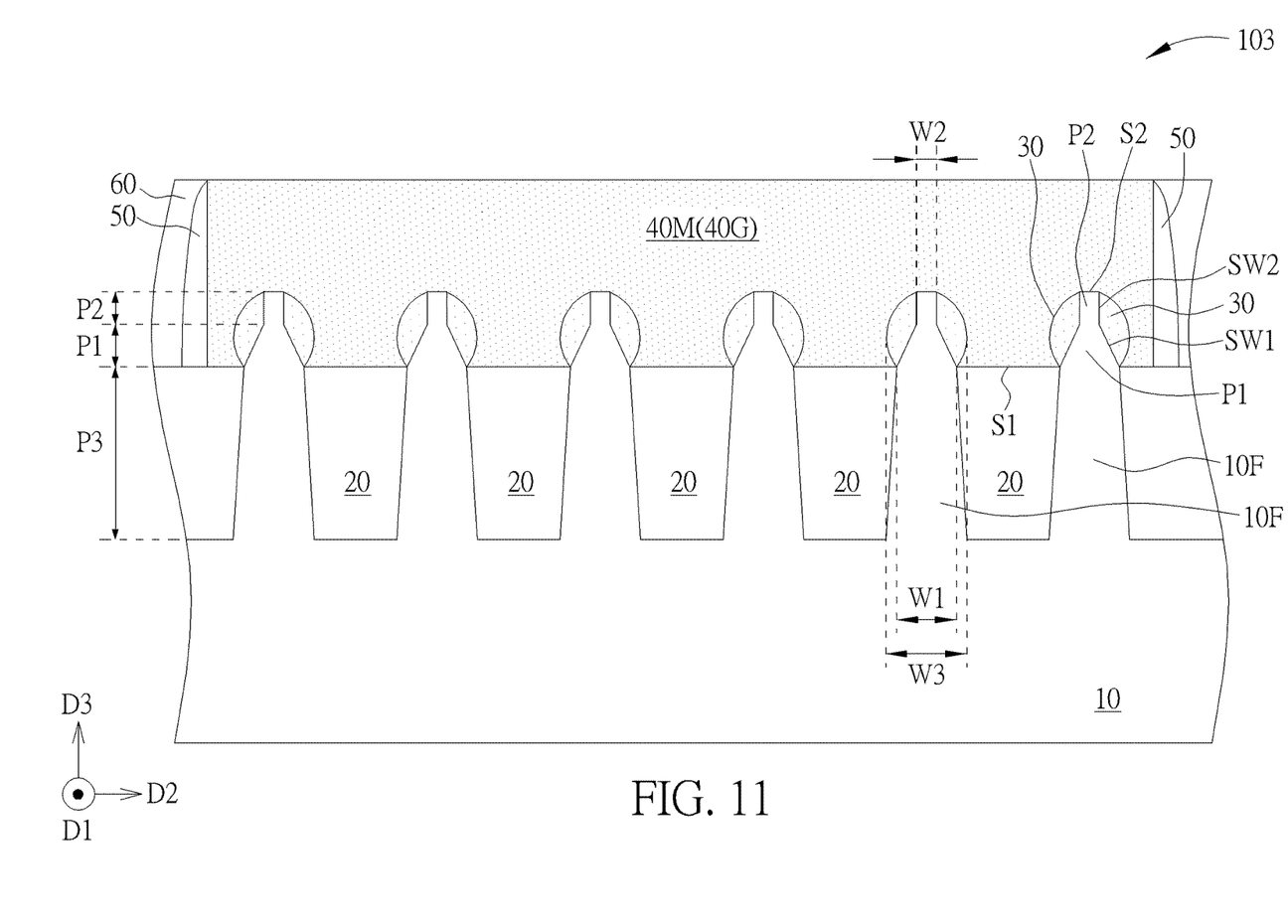

Please refer to FIGS. 7-11. FIGS. 7-11 are schematic drawings illustrating a manufacturing method of a semiconductor device according to a third embodiment of the present invention. As shown in FIG. 7, the difference between the manufacturing method in this embodiment and the manufacturing method in the first embodiment mentioned above is that a dummy gate structure 40D may be formed straddling the fin shaped structures 10F. In some embodiments, the material of the dummy gate structure 40D may include a semiconductor material such as polysilicon and amorphous silicon, but not limited thereto. In addition, the spacer 50 may be formed on the sidewall of the dummy gate structure 40D, and an interlayer dielectric layer 60 may be formed covering the dummy gate structure 40D and the spacer 50. Subsequently, a planarization process such as a chemical mechanical polishing process may be performed to remove the interlayer dielectric layer 60 above the dummy gate structure 40D and expose the dummy gate structure 40D. As shown in FIG. 8, the dummy gate structure 40D is removed for forming a gate trench TR surrounded by the spacer 50 and exposing apart of each of the fin shaped structures 10F. In other words, the gate trench TR may expose the top portion of each of the fin shaped structures 10F which is not covered by the isolation structure 20. As shown in FIG. 9, the etching process 91 is performed subsequently for forming the first portion P1 and the second portion P2 of each of the fin shaped structures 10F. In other words, as shown in FIGS. 7-9, in some embodiments, the dummy gate structure 40D may be formed before the etching process 91, and the dummy gate structure 40D may be removed before the etching process 91, but not limited thereto. Subsequently, as shown in FIG. 10, a process, such as a selective epitaxial growth process, may be performed to form the cladding layer 30 on the first portion P1 and the second portion P2 of each of the fin shaped structures 10F exposed by the gate trench TR. As shown in FIG. 9 and FIG. 10, the gate structure 40G may then be formed in the gate trench TR, and the gate structure 40G may include a metal gate structure 40M. In some embodiments, the metal gate structure 40M may be composed of a high-k dielectric layer, a work function metal layer, a barrier layer, and a low resistivity metal conductive material, but not limited thereto. In other words, the semiconductor device 103 in this embodiment may include the metal gate structure 40M straddling the fin shaped structures 10F and the cladding layer 30.

To summarize the above descriptions, in the semiconductor device and the manufacturing method according to the present invention, the first portion and the second portion of the fin shaped structure above the top surface of the isolation structure may be formed by the etching process, and the width of the second portion is smaller than the width of the first portion. The cladding layer having the curved surface is formed on the first portion and the second portion of the fin shaped structure. The first portion and the second portion of the fin shaped structure and the cladding layer may form the channel region of the semiconductor device. The cladding layer disposed on the two opposite sides of the first portion and the second portion of the fin shaped structure may provide a compressive stress to the fin shaped structure for enhancing the carrier mobility of the channel region. Additionally, the contact area between the gate structure and the cladding layer may be increased because the cladding layer has the curved surface protruding outwards, and the electrical performance of the semiconductor device may be further enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a semiconductor substrate comprising fin shaped structures;
    an isolation structure disposed between the fin shaped structures, wherein each of the fin shaped structures comprises:
        a first portion disposed above a top surface of the isolation structure; and
        a second portion disposed on the first portion, wherein a width of the second portion is smaller than a width of the first portion;
    a cladding layer disposed on the first portion and the second portion of each of the fin shaped structures, wherein the cladding layer comprises a curved surface;
    a gate structure disposed straddling the fin shaped structures and the cladding layer disposed on each of the fin structures; and
    a gate spacer disposed directly on the cladding layer, wherein a material composition of the gate spacer comprises oxide or oxynitride.

2. The semiconductor device according to claim 1, wherein the gate structure is partially disposed on the cladding layer.

3. The semiconductor device according to claim 1, wherein the first portion and the second portion of each of the fin shaped structures protrude from the top surface of the isolation structure.

4. The semiconductor device according to claim 1, wherein a maximum width of the cladding layer disposed on one of the fin shaped structures is larger than the width of the first portion of the fin shaped structure.

5. The semiconductor device according to claim 1, wherein the cladding layer is disposed on a sidewall of the first portion of each of the fin shaped structures and a sidewall of the second portion of each of the fin shaped structures.

6. The semiconductor device according to claim 5, wherein the cladding layer is further disposed on a top surface of the second portion of each of the fin shaped structures.

7. The semiconductor device according to claim 5, wherein a slope of the first sidewall of the first portion of each of the fin shaped structures is smaller than a slope of the second sidewall of the second portion of each of the fin shaped structures.

8. The semiconductor device according to claim 1, wherein a lattice constant of the cladding layer is different from a lattice constant of each of the fin shaped structures.

9. The semiconductor device according to claim 1, wherein a part of the gate structure is disposed between two of the fin structures adjacent to each other and disposed between the cladding layers disposed on the two fin structures adjacent to each other.

10. The semiconductor device according to claim 1, wherein a top surface of the second portion of each of the fin shaped structures is not covered by the cladding layer.

11. The semiconductor device according to claim 1, wherein a topmost surface of the cladding is not higher than a top surface of the second portion of each of the fin shaped structures.

12. A manufacturing method of a semiconductor device, comprising:

providing a semiconductor substrate, the semiconductor substrate comprising fin shaped structures;

forming an isolation structure between the fin shaped structures, wherein each of the fin shaped structures comprises:
- a first portion disposed above a top surface of the isolation structure; and
- a second portion disposed on the first portion, wherein a width of the second portion is smaller than a width of the first portion;

forming a cladding layer on the first portion and the second portion of each of the fin shaped structures, wherein the cladding layer comprises a curved surface;

forming a gate structure straddling the fin shaped structures and the cladding layer disposed on each of the fin structures; and forming a gate spacer directly on the cladding layer, wherein a material composition of the gate spacer comprises oxide or oxynitride.

13. The manufacturing method of the semiconductor device according to claim 12, wherein the first portion and the second portion of each of the fin shaped structures is formed by performing an etching process to the fin shaped structures after the step of forming the isolation structure.

14. The manufacturing method of the semiconductor device according to claim 13, wherein the etching process comprises a wet etching process using tetramethylammonium hydroxide (TMAH).

15. The manufacturing method of the semiconductor device according to claim 13, further comprising:
forming a dummy gate structure straddling the fin shaped structures before the etching process; and
removing the dummy gate structure for exposing a part of each of the fin shaped structures before the etching process.

16. The manufacturing method of the semiconductor device according to claim 12, wherein the gate structure is formed after the step of forming the cladding layer, and the gate structure comprises a dummy gate structure or a metal gate structure.

17. The manufacturing method of the semiconductor device according to claim 12, wherein a width of the cladding layer formed on one of the fin shaped structures is larger than the width of the first portion of the fin shaped structure.

18. The manufacturing method of the semiconductor device according to claim 12, wherein the cladding layer is formed on a sidewall of the first portion of each of the fin shaped structures and a sidewall of the second portion of each of the fin shaped structures.

19. The manufacturing method of the semiconductor device according to claim 18, wherein the cladding layer is further formed on a top surface of the second portion of each of the fin shaped structures.

20. The manufacturing method of the semiconductor device according to claim 18, wherein a slope of the first sidewall of the first portion of each of the fin shaped structures is smaller than a slope of the second sidewall of the second portion of each of the fin shaped structures.

21. The manufacturing method of the semiconductor device according to claim 12, wherein the step of forming the cladding layer comprises a selective epitaxial growth (SEG) process.

22. The manufacturing method of the semiconductor device according to claim 12, wherein a lattice constant of the cladding layer is different from a lattice constant of each of the fin shaped structures.

* * * * *